United States Patent
Hasegawa et al.

[11] Patent Number: 5,886,369
[45] Date of Patent: Mar. 23, 1999

[54] EPITAXIAL WAFER FOR GAP PURE GREEN LIGHT-EMITTING DIODE AND GAP PURE GREEN LIGHT-EMITTING DIODE

[75] Inventors: Koichi Hasegawa; Koichiro Takahashi, both of Chichibu, Japan

[73] Assignee: Showa Denko K.K., Tokyo, Japan

[21] Appl. No.: 965,192

[22] Filed: Nov. 6, 1997

[30] Foreign Application Priority Data

Dec. 16, 1996 [JP] Japan .................................. 8-335687

[51] Int. Cl.$^6$ ............................................. H01L 27/15
[52] U.S. Cl. ........................... 257/86; 257/87; 257/101; 257/102; 257/103
[58] Field of Search ............................. 257/86, 87, 101, 257/102, 103

[56] References Cited

U.S. PATENT DOCUMENTS 4,965,644  10/1990  Kawabata et al. ...................... 257/88

FOREIGN PATENT DOCUMENTS 59-22376  2/1984  Japan .

*Primary Examiner*—Mihn Loan Tran
*Attorney, Agent, or Firm*—Armstrong, Westerman, Hattori, McLeland & Naughton

[57] ABSTRACT

An epitaxial wafer for a GaP pure green light emitting diode includes an n-type single crystal GaP substrate formed in order thereon with a first n-type GaP epitaxial layer, a second n-type GaP epitaxial layer and a p-type GaP epitaxial layer. The p-type GaP epitaxial layer has a sulfur concentration of not greater than $1 \times 10^{17}$ cm$^{313}$ , the second n-type GaP epitaxial layer has a carrier concentration on a side thereof interfacing with the p-type GaP epitaxial layer of $0.5-5 \times 10^{17}$ cm$^{-3}$, and the p-type GaP epitaxial layer has a carrier concentration on a side thereof interfacing with the second n-type GaP epitaxial layer that is $1-10 \times 10^{17}$ cm$^{-3}$ and is not less than twice the carrier concentration of the second n-type GaP epitaxial layer on the side thereof interfacing with the p-type GaP epitaxial layer. A GaP pure green light-emitting diode exhibiting high brightness includes the epitaxial wafer, an n-type electrode provided on a back surface of the single crystal substrate and a p-type electrode provided on the upper surface of the p-type GaP epitaxial layer.

16 Claims, 4 Drawing Sheets

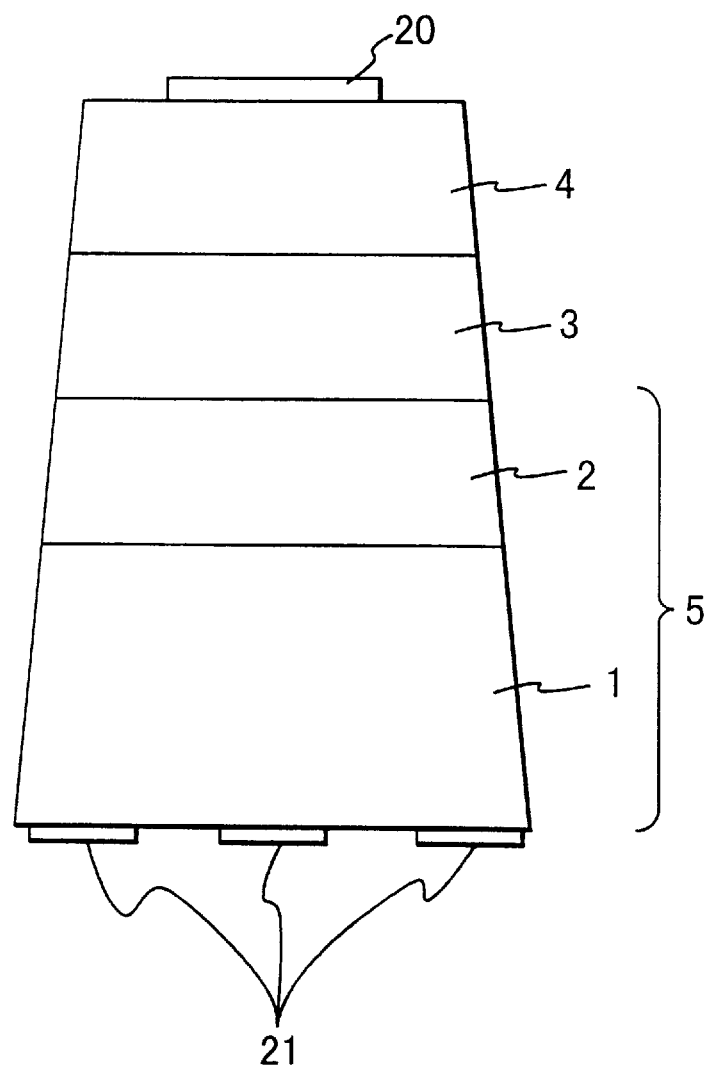

5,886,369

EPITAXIAL WAFER FOR GAP PURE GREEN LIGHT-EMITTING DIODE AND GAP PURE GREEN LIGHT-EMITTING DIODE

BACKGROUND OF THE INVENTION

1. Field of the Invention

This invention relates to an epitaxial wafer for GaP (gallium phosphide) pure green light-emitting diode and to a GaP pure green light-emitting diode fabricated using the epitaxial wafer.

2. Description of the Prior Art

GaP has a relatively large band gap of around 2.26 eV, corresponding to the green wavelength, and is therefore used as a material for greenish light-emitting diodes. Since GaP is an indirect transition semiconductor, its light-emitting efficiency is ordinarily increased by doping the n-type GaP epitaxial layer forming the p-n junction with nitrogen, which functions as light-emitting centers.

As the light emitted by this diode has a wavelength of about 565–570 nm, however, its color is yellowish-green.

Unlike this yellowish-green light-emitting diode, another known light-emitting diode achieves pure green light emission in the 555–560 nm wavelength range by direct recombination of electrons and holes, without doping the n-type GaP epitaxial layer forming the p-n junction and constituting the light-emitting layer with nitrogen or other impurity to function as light-emitting centers. The general structure of the epitaxial wafer for this GaP pure green light-emitting diode is shown in FIG. 1. Reference numeral 1 in FIG. 1 designates an n-type single crystal GaP substrate, 2 a first n-type GaP epitaxial layer, 3 a second n-type GaP epitaxial layer not doped with nitrogen, and 4 a p-type GaP epitaxial layer. Reference numeral 5 designates a substrate constituted of the n-type single crystal GaP substrate 1 and the first n-type GaP epitaxial layer 2 formed thereon.

This epitaxial wafer for a pure green light-emitting diode is generally fabricated by impurity overcompensation liquid-phase epitaxial growth. An example of this fabrication method utilizing the well-known sliding boat method is briefly explained in the following.

The substrate 5 ordinarily used consists of the n-type single crystal GaP substrate 1 and the n-type GaP epitaxial layer (first n-type GaP epitaxial layer) 2 formed thereon as a buffer layer.

The substrate 5 formed with the first n-type GaP epitaxial layer 2 (buffer layer) is set in the substrate holder of the boat, and the Ga metal and GaP polycrystal for forming the epitaxial growth melt are placed in the melt container. The slide boat is inserted into an epitaxial growth furnace with the substrate and epitaxial growth melt still separated. The furnace is heated to a prescribed level of around 1000° C. in a stream of hydrogen to melt the GaP polycrystal into the Ga metal to the point of saturation. At this time, sulfur is added to the epitaxial growth melt by, for example, simultaneously passing a prescribed amount of $H_2S$ gas together with the hydrogen stream. Other methods of sulfur addition are also available, including that of adding sulfur or a sulfur compound directly to the epitaxial growth melt.

After the epitaxial growth melt has stood long enough to become uniform, the substrate holder of the slide boat and the melt container are slid to guide the epitaxial growth melt onto the substrate. The melt and the substrate are then gradually cooled to about 900° C. to grow the second n-type GaP epitaxial layer 3. The second n-type GaP epitaxial layer 3 includes sulfur as a dopant but is not doped with nitrogen.

With the temperature maintained, zinc is supplied to the epitaxial growth melt from a gas phase, for instance, in an amount sufficient to impart the epitaxial growth melt with p-type conductivity by compensating the sulfur therein.

Gradual cooling to a temperature of about 800° C. is then effected to grow the p-type GaP epitaxial layer 4.

When the growth is complete, the substrate and the epitaxial growth melt are separated and cooled to normal room temperature. A light-emitting diode fabricated from the epitaxial wafer obtained in this way emits pure green light with a peak wavelength around 555–560 nm.

In this GaP pure green light-emitting diode, either the p-type layer or the n-type layer can be made the light-emitting layer by appropriately selecting the carrier concentration of the p-type layer and the n-type layer in the p-n junction section. Specifically, the n-type layer becomes the light-emitting layer when the carrier concentration on the side of the p-type layer interfacing with the n-type layer is made higher than the carrier concentration on the side of the n-type layer interfacing with the p-type layer and the p-type layer becomes the light-emitting layer when the carrier concentration on the side of the n-type layer interfacing with the p-type layer is made higher than the carrier concentration on the side of the p-type layer interfacing with the n-type layer.

The purity of the light emitted by the aforesaid pure green light emitting diode is superior to that emitted by the yellowish green light-emitting diode and the light color is more appealing. Since it does not use nitrogen as light emission centers, however, it is lower in brightness than the yellowish green light-emitting diode. Higher brightness is therefore required to melt the demands of the market.

Methods for increasing the brightness of a pure green light emitting diode include, for example, that taught by Japanese Patent Public Disclosure 59-22376 (hereinafter JP-A 59-22376). In this method, brightness is heightened by using the impurity compensation method with reducing the donor concentration in the p-type Gap. However, the increased brightness afforded by this and other prior-art methods is not sufficient to satisfy increasingly severe user requirements.

One object of this invention is to provide an epitaxial wafer for fabricating GaP pure green light emitting diodes with greatly enhanced emission brightness wherein an n-type epitaxial layer forming a p-n junction to function as a light-emitting layer is not doped with impurity functioning as light-emitting centers such as nitrogen.

Another object of the invention is to provide a GaP pure green light-emitting diode fabricated using the epitaxial wafer.

SUMMARY OF THE INVENTION

For achieving these objects the invention provides an epitaxial wafer for a GaP pure green light emitting diode comprising an n-type single crystal GaP substrate formed in order thereon with a first n-type GaP epitaxial layer, a second n-type GaP epitaxial layer not doped with nitrogen and a p-type GaP epitaxial layer, the p-type GaP epitaxial layer having a sulfur concentration of not greater than $1 \times 10^{17}$ cm$^{-3}$, the second n-type GaP epitaxial layer having a carrier concentration on a side thereof interfacing with the p-type GaP epitaxial layer of $0.5$–$5 \times 10^{17}$ cm$^{-3}$, and the p-type GaP epitaxial layer having a carrier concentration on a side thereof interfacing with the second n-type GaP epitaxial layer that is $1-10\times10^{17}$ cm$^{-3}$ and is not less than twice the carrier concentration of the second n-type GaP epitaxial layer on the side thereof interfacing with the p-type GaP epitaxial layer.

The second n-type GaP epitaxial layer of the wafer preferably has a carrier concentration on the side thereof interfacing with the p-type GaP epitaxial layer of $1-3\times10^{17}$ cm$^{-3}$.

The p-type GaP epitaxial layer of the wafer preferably has a carrier concentration on an upper surface side thereof in the range of $10-50\times10^{17}$ cm$^{-3}$.

The second n-type GaP epitaxial layer and the p-type GaP epitaxial layer are preferably epitaxial layers grown from different epitaxial growth melts.

The GaP pure green light-emitting diode according to this invention comprises the aforesaid epitaxial wafer, an n-type electrode provided on a lower surface of the single crystal substrate and a p-type electrode provided on the upper surface of the p-type GaP epitaxial layer.

By defining the sulfur concentration in the p-type GaP epitaxial layer as not greater than $1\times10^{17}$ cm$^{-3}$ and constituting the second n-type GaP epitaxial layer as the light-emitting layer in the foregoing manner, the invention provides a pure green light-emitting diode with enhanced brightness.

The above and other features of the present invention will become apparent from the following description made with reference to the drawings.

BRIEF EXPLANATION OF THE DRAWINGS

FIG. 7 is a diagram showing the structure of a GaP pure green light-emitting diode constituted by providing electrodes on the epitaxial wafer of FIG. 1.

DESCRIPTION OF THE PREFERRED EMBODIMENTS

Figure 1:
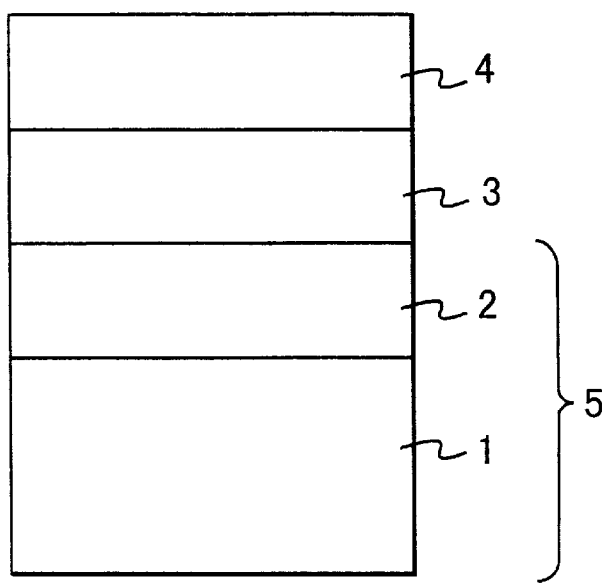
FIG. 1 is a diagram showing the structure of an epitaxial wafer for fabricating GaP pure green light emitting diodes.

When an epitaxial wafer for fabricating GaP (gallium phosphide) pure green light-emitting diodes is fabricated by the impurity compensation method, the second n-type GaP epitaxial layer and the p-type GaP epitaxial layer are generally successively grown from the same epitaxial growth melt. This is considered to provide a p-n junction with better crystallinity than in the case where the second n-type layer and the p-type layer are grown separately. The impurity compensation method is therefore the main method used to fabricate epitaxial wafers for GaP pure green light emitting diodes.

To secure high brightness by the impurity compensation method, methods such as that taught by the aforesaid JP-A 59-22376 have been proposed. This method achieves high brightness by keeping the donor concentration of the p-type GaP epitaxial layer at or below $5\times10^{16}$ cm$^{-3}$.

This prior-art method uses the p-type layer for light emission in order to reduce internal absorption. To make the p-type layer emit light, the carrier concentration of the p-type layer has to be made lower than that of the n-type layer in the vicinity of the p-n junction interface. This is in fact the case in JP-A 59-22376, which achieves high brightness by reducing the donor concentration in the p-type layer constituting the light-emitting layer.

When, conversely to the method of JP-A 59-22376, the n-type layer is made the light emitting layer, i.e., when the carrier concentration of the p-type layer is made higher than that of the n-type layer in the vicinity of the p-n junction interface, the p-type layer does not emit light. Up to now, therefore, only carrier concentration of the p-type layer after impurity compensation has been considered in order to control the efficiency of hole injection to the n-type layer and no consideration has been given to the donor concentration of the p-type layer.

Suspecting that the donors in the p-type layer have some effect on brightness also when the n-type layer is made the light emitting layer, the inventors first investigated how brightness varies with sulfur concentration in the p-type layer in a light-emitting diode fabricated using the impurity compensation method.

For this, they used the impurity compensation method to fabricate light-emitting diodes whose p-type GaP epitaxial layers differed in sulfur concentration. Specifically, they prepared substrates each consisting of an n-type single crystal GaP substrate formed with a first n-type GaP epitaxial layer as a buffer layer and then used the impurity compensation method to form a second n-type GaP epitaxial layer and a p-type GaP epitaxial layer on the substrate in this order. The carrier concentration of the second n-type GaP epitaxial layer on the side thereof interfacing with the p-type GaP epitaxial layer was set at $2\times10^{17}$ cm$^{-3}$ and the carrier concentration of the p-type GaP epitaxial layer on the side thereof interfacing with the second n-type GaP epitaxial layer was set at $8\times10^{17}$ cm$^{-3}$ in all of the light-emitting diodes, and only the sulfur concentration in the p-type GaP epitaxial layer was varied. The light-emitting diodes fabricated in this manner were used to investigate how brightness varies with the sulfur concentration in the p-type GaP epitaxial layer.

The sulfur concentration was varied by the method of JP-A 59-22376, wherein the step of forming the p-type GaP epitaxial layer is preceded by a step of maintaining the growth atmosphere at a low pressure to reduce donor impurity.

Figure 2:
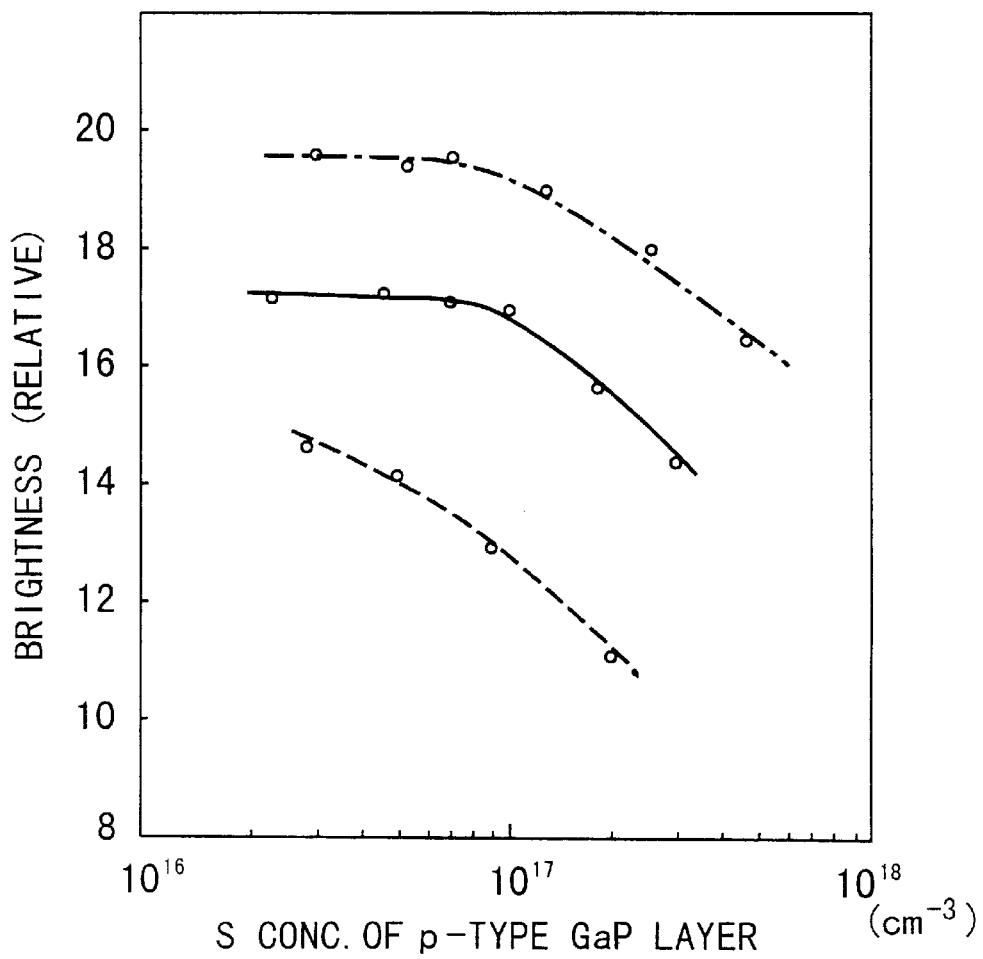
FIG. 2 is a graph showing how the brightness of a light-emitting diode varies with the sulfur concentration in a p-type GaP epitaxial layer thereof.

As can be seen from the results shown by the blank circles and solid curve in FIG. 2, the brightness varied with sulfur concentration, with the brightness being high when the sulfur concentration in the p-type GaP epitaxial layer was not greater than $1\times10^{17}$ cm$^{-3}$ and decreasing progressively at sulfur concentrations greater than $1\times10^{17}$ cm$^{-3}$.

For comparison, variation of brightness with p-type layer sulfur concentration was also investigated for light-emitting diodes fabricated according to JP-A 59-22376 to have the carrier concentration of the p-type GaP epitaxial layer set smaller than that of the second n-type GaP epitaxial layer, i.e., so that the p-type layer was the light-emitting layer.

Specifically, substrates each consisting of an n-type single crystal GaP substrate formed with a first n-type GaP epitaxial layer as a buffer layer were prepared and the impurity compensation method was used to form a second n-type GaP epitaxial layer and a p-type GaP epitaxial layer on the substrate in this order. The carrier concentration of the second n-type GaP epitaxial layer on the side thereof interfacing with the p-type GaP epitaxial layer was set at $2 \times 10^{17}$ cm$^{-3}$ and the carrier concentration of the p-type GaP epitaxial layer on the side thereof interfacing with the second n-type GaP epitaxial layer was set at $1 \times 10^{17}$ cm$^{-3}$ in all of the light-emitting diodes, and only the sulfur concentration in p-type GaP epitaxial layer was varied. The light-emitting diodes fabricated in this manner were used to investigate how brightness varies with the sulfur concentration in the p-type GaP epitaxial layer.

As can be seen from the results shown by the solid circles and broken curve in FIG. 2, brightness increased with decreasing sulfur concentration in the p-type layer. This relationship is the same as in the diode of JP-A 59-22376 but is clearly different from the relationship between brightness and sulfur concentration in the p-type layer when, as in this invention, the carrier concentration of the p-type layer is made greater than that of the n-type layer, i.e., when the n-type layer is made the light-emitting layer (blank circles and solid curve in FIG. 2). Specifically, higher brightness is obtained when the n-type layer is used as the light-emitting layer and the sulfur concentration in the p-type layer is set at not greater than $1 \times 10^{17}$ cm$^{-3}$.

Next, the inventors investigated how brightness varies with the carrier concentration of the second n-type GaP epitaxial layer on the side thereof interfacing with the p-type GaP epitaxial layer. Light-emitting diodes were fabricated in which the carrier concentration of the p-type GaP epitaxial layer on the side thereof interfacing with the second n-type GaP epitaxial layer was set at $8 \times 10^{17}$ cm$^{-3}$ and the sulfur concentration in the p-type layer was set at $7 \times 10^{16}$ cm$^{-3}$, and only the carrier concentration of the second n-type GaP epitaxial layer on the side thereof interfacing with the p-type GaP epitaxial layer was varied.

Figure 3:
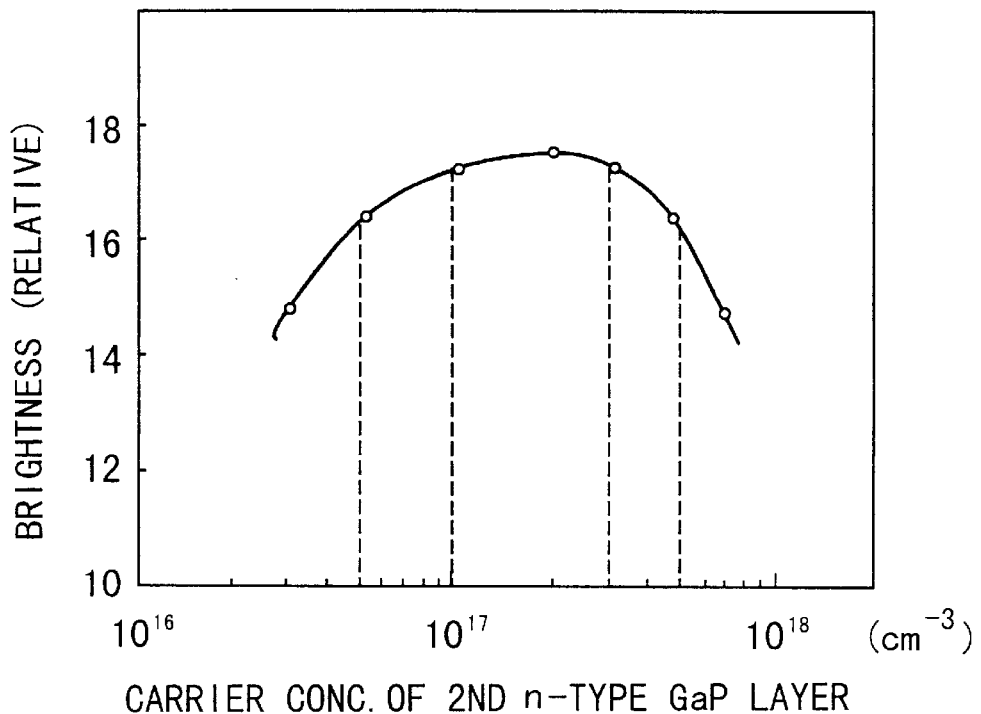
FIG. 3 is a graph showing how the brightness of the light-emitting diode varies with the carrier concentration of a second n-type GaP epitaxial layer on the side thereof interfacing with the p-type GaP epitaxial layer.

As can be seen from the results shown in FIG. 3, high brightness was obtained when the carrier concentration of the second n-type GaP epitaxial layer on the side thereof interfacing with the p-type GaP epitaxial layer was $0.5-5 \times 10^{17}$ cm$^{-3}$, particularly when it was $1-3 \times 10^{17}$ cm$^{-3}$.

The inventors also investigated how brightness varies with the carrier concentration of the p-type GaP epitaxial layer on the side thereof interfacing with the second n-type GaP epitaxial layer. Light-emitting diodes were fabricated in which the carrier concentration of the second n-type GaP epitaxial layer on the side thereof interfacing with the p-type GaP epitaxial layer was set at $2 \times 10^{17}$ cm$^{-3}$ and the sulfur concentration in the p-type GaP epitaxial layer was set at $7 \times 10^{16}$ cm$^{-3}$, and only the carrier concentration of the p-type GaP epitaxial layer on the side thereof interfacing with the second n-type GaP epitaxial layer was varied.

Figure 4:
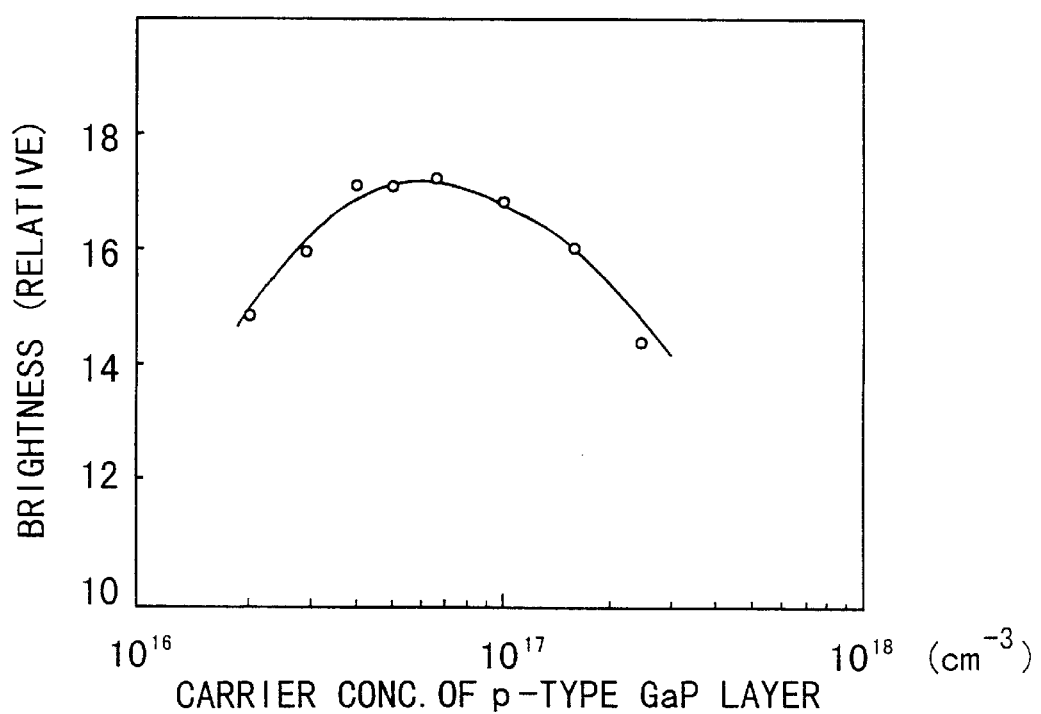
FIG. 4 is a graph showing how the brightness of the light-emitting diode varies with the carrier concentration of the p-type GaP epitaxial layer on the side thereof interfacing with the second n-type GaP epitaxial layer.

As can be seen from the results shown in FIG. 4, high brightness was obtained when the carrier concentration of the p-type GaP epitaxial layer on the side thereof interfacing with the second n-type GaP epitaxial layer was in the range of $4-10 \times 10^{17}$ cm$^{-3}$.

The inventors similarly investigated how brightness varies with the carrier concentration of the p-type GaP epitaxial layer on the side thereof interfacing with the second n-type GaP epitaxial layer at other values of the carrier concentration of the second n-type GaP epitaxial layer on the side thereof interfacing with the p-type GaP epitaxial layer in the range of $0.5-5 \times 10^{17}$ cm$^{-3}$. At all carrier concentration values within this range, brightness was high when the carrier concentration of the p-type GaP epitaxial layer on the side thereof interfacing with the second n-type GaP epitaxial layer was not less than twice the carrier concentration of the second n-type GaP epitaxial layer on the side thereof interfacing with the p-type GaP epitaxial layer and not greater than $10 \times 10^{17}$ cm$^{-3}$.

Specifically, high brightness was achieved when the sulfur concentration in the p-type GaP epitaxial layer was not greater than $1 \times 10^{17}$ cm$^{-3}$, the carrier concentration of the p-type GaP epitaxial layer on the side thereof interfacing with the second n-type GaP epitaxial layer was not less than twice the carrier concentration of the second n-type GaP epitaxial layer on the side thereof interfacing with the p-type GaP epitaxial layer, the carrier concentration of the second n-type GaP epitaxial layer on the side thereof interfacing with the p-type GaP epitaxial layer was $0.5-5 \times 10^{17}$ cm$^{-3}$, preferably $1-3 \times 10^{17}$ cm$^{-3}$, and the carrier concentration of the p-type GaP epitaxial layer on the side thereof interfacing with the second n-type GaP epitaxial layer was $1-10 \times 10^{17}$ cm$^{-3}$.

An epitaxial wafer for fabricating light-emitting diodes is ordinarily formed with ohmic electrodes on its upper and lower surfaces and then divided into individual light-emitting diodes by dicing or the like. Since the pure green light-emitting diode of this invention has a p-type upper surface, an alloy such as Au—Be or Au—Zn is deposited on the upper surface and then thermally annealed to form an ohmic electrode.

Proper formation of an ohmic electrode is liable to be difficult, however, when the carrier concentration on the upper surface side of the p-type GaP epitaxial layer is $10 \times 10^{17}$ cm$^{-3}$ or less. The inventors therefore fabricated and investigated the characteristics of light-emitting diodes wherein the carrier concentration of the p-type GaP epitaxial layer was greater on the upper surface side than on the side thereof interfacing with the second n-type GaP epitaxial layer and was set at different values exceeding $10 \times 10^{17}$ cm$^{-3}$ among the different light-emitting diode specimens.

Brightness was found to decrease when the carrier concentration on the upper surface side exceeded $50 \times 10^{17}$ cm$^{-3}$. This is thought to be because internal absorption increases at high upper surface carrier concentration. The invention therefore specifies the carrier concentration on the upper surface side of the p-type GaP epitaxial layer to be $10-50 \times 10^{17}$ cm$^{-3}$.

Seeking ways to secure still higher brightness, the inventors further looked into the method of growing the second n-type GaP epitaxial layer and the p-type GaP epitaxial layer not by the impurity compensation method but from separate epitaxial growth melts.

Specifically, they fabricated light-emitting diodes by preparing substrates each consisting of an n-type single crystal GaP substrate formed with a first n-type GaP epitaxial layer as a buffer layer and then using separate epitaxial growth melts to form a second n-type GaP epitaxial layer and a p-type GaP epitaxial layer on the substrate in this order. The carrier concentration of the second n-type GaP epitaxial layer on the side thereof interfacing with the p-type GaP epitaxial layer was set at $2 \times 10^{17}$ cm$^{-3}$ and the carrier concentration of the p-type GaP epitaxial layer on the side thereof interfacing with the second n-type GaP epitaxial layer was set at $8 \times 10^{17}$ cm$^{-3}$, and only the sulfur concentration in p-type GaP epitaxial layer was varied. The light-emitting diodes fabricated in this manner were used to investigate how brightness varies with the sulfur concentration in the p-type GaP epitaxial layer.

As can be seen from the results shown by the blank boxes and one-dot-chain curve in FIG. 2, the brightness was higher when the second n-type GaP epitaxial layer and the p-type GaP epitaxial layer were grown from separate epitaxial growth melts than when they were grown by the impurity compensation method.

When the impurity compensation method is used, growth of the p-type GaP epitaxial layer must be preceded by a step of maintaining a reduced-pressure growth atmosphere at a prescribed temperature of about 900° C. for 1–3 hours. The method of effecting growth with separate epitaxial growth melts is thought to achieve higher brightness by eliminating the need for this step, but the exact mechanism is unknown.

While the invention will now be explained with reference to specific examples, it should be understood that the invention is in no way limited to these examples.

Example 1

A Si-doped single crystal substrate fabricated by the liquid encapsulated Czochralski (LEC) method was used as the n-type single crystal GaP substrate 1. The substrate had a carrier concentration of $2 \times 10^{17}$ cm$^{-3}$ and the surface orientation was (111) B. The substrate 5 was obtained by forming the first n-type GaP epitaxial layer 2 (buffer layer) on the single crystal substrate 1 using the ordinary epitaxial growth method. The first n-type GaP epitaxial layer 2 was doped with Si to have a carrier concentration of $4 \times 10^{17}$ cm$^{-3}$ and was formed to a thickness of 60 μm.

Figure 5:
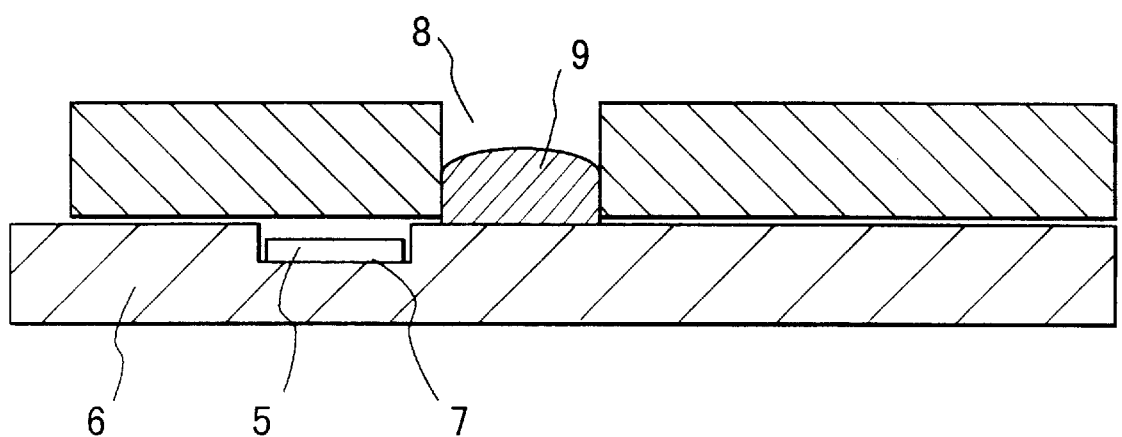
FIG. 5 is a schematic sectional view of a sliding boat used for epitaxial growth in a first embodiment of the invention and a comparative example.

The substrate 5 formed with the first n-type GaP epitaxial layer 2 was set in the substrate chamber 7 in the substrate holder 6 of the sliding boat shown in FIG. 5. Ga metal and GaP polycrystal for forming an epitaxial growth melt 9 were placed in the melt container 8. The slide boat was placed in an epitaxial growth furnace (not shown) with the substrate 5 and the epitaxial growth melt 9 still separated. The furnace was heated to 1000° C. in a stream of hydrogen and maintained at 1000° C. for one hour. At this time, sulfur was incorporated into epitaxial growth melt 9 by adding a prescribed concentration of H$_2$S gas to the hydrogen stream.

After one hour in this state, addition of H$_2$S gas was discontinued and the substrate holder 6 was slid to guide the epitaxial growth melt 9 onto the substrate 5. The melt and the substrate were then gradually cooled to 900° C. at a cooling rate of 1° C./minute to grow the second n-type GaP epitaxial layer 3 including sulfur as a dopant but not doped with nitrogen.

With the temperature maintained at 900° C., the pressure in the epitaxial growth furnace was reduced to and maintained at 0.03 torr for 1.5 hours to evaporate the sulfur from the epitaxial growth melt. The furnace was then restored to normal pressure, hydrogen was passed, and zinc vapor was added to the hydrogen stream to incorporate a prescribed amount of zinc into the epitaxial growth melt.

The temperature was then gradually lowered to 800° C. at a cooling rate of 1° C./minute to grow the p-type GaP epitaxial layer 4.

The amount of zinc vapor added was increased when the temperature fell below 850° C. in, order to make the carrier concentration of the p-type GaP epitaxial layer 4 higher on the upper surface side than on the side thereof interfacing with the second n-type GaP epitaxial layer 3.

When the growth stopped, the substrate and the epitaxial growth melt were separated and cooled to normal room temperature.

In the epitaxial wafer obtained, the carrier concentration of the second n-type GaP epitaxial layer 3 on the side thereof interfacing with the p-type GaP epitaxial layer 4 was $2 \times 10^{17}$ cm$^{-3}$. The carrier concentration of the p-type GaP epitaxial layer 4 on the side thereof interfacing with the second n-type GaP epitaxial layer 3 was $6 \times 10^{17}$ cm$^{-3}$ and the carrier concentration on the upper surface side thereof was $20 \times 10^{17}$ cm$^{3}$. The sulfur concentration in the p-type GaP epitaxial layer 4 was $5 \times 10^{16}$ cm$^{-3}$.

AuGe was deposited on the back surface of the substrate of the epitaxial wafer for fabricating GaP pure green light emitting diodes obtained in the foregoing manner and AuBe was deposited on the upper surface of the p-type GaP epitaxial layer thereof. The deposited alloys were thermally annealed and then etched to form n electrodes and p electrodes using photo-lithography. The epitaxial wafer was then divided into individual chips to provide GaP pure green light emitting diodes of the structure shown in FIG. 7.

Reference numeral 1 in FIG. 7 designates the n-type single crystal GaP substrate, 2 the first n-type GaP epitaxial layer, 3 the second n-type GaP epitaxial layer not doped with nitrogen, and 4 the p-type GaP epitaxial layer. Reference numeral 5 designates the substrate constituted of the n-type single crystal GaP substrate 1 and the first n-type GaP epitaxial layer 2 formed thereon. Reference numeral 20 designates a p-type electrode and reference numeral 21 designates n-type electrodes.

The brightness of a light-emitting diode specimen fabricated from the epitaxial wafer is shown in Table 1.

Comparative Example

An epitaxial wafer was fabricated by the method of Example 1 except that the zinc vapor passed into the hydrogen stream was adjusted to make the carrier concentration of the p-type GaP epitaxial layer 4 on the side thereof interfacing with the second n-type GaP epitaxial layer 3 lower than the carrier concentration of the second n-type GaP epitaxial layer 3 on the side thereof interfacing with the p-type GaP epitaxial layer 4.

In the epitaxial wafer obtained, the carrier concentration of the second n-type GaP epitaxial layer 3 on the side thereof interfacing with the p-type GaP epitaxial layer 4 was $2 \times 10^{17}$ cm$^{-3}$. The carrier concentration of the p-type GaP epitaxial layer 4 on the side thereof interfacing with the second n-type GaP epitaxial layer 3 was $1 \times 10^{17}$ cm$^{-3}$ and the carrier concentration on the upper surface side thereof was $20 \times 10^{17}$ cm$^{-3}$. The sulfur concentration in the p-type GaP epitaxial layer 4 was $5 \times 10^{16}$ cm$^{-3}$.

GaP light-emitting diodes were fabricated from the so-obtained epitaxial wafer in the manner of Example 1.

The brightness of a light-emitting diode specimen fabricated from the epitaxial wafer is shown in Table 1.

An example will now be explained in which the epitaxial wafer for a GaP pure green light emitting diode according to the invention having the structure shown in FIG. 1 was fabricated by growing the second n-type GaP epitaxial layer and the p-type GaP epitaxial layer from different epitaxial growth melts.

Example 2

As in Example 1, a Si-doped single crystal substrate fabricated by the LEC method was used as the n-type single crystal GaP substrate 1. The substrate had a carrier concentration of $2 \times 10^{17}$ cm$^{-3}$ and the surface orientation was (111) B. The substrate 5 was obtained by forming the first n-type GaP epitaxial layer 2 (buffer layer) on the single crystal substrate 1 using the ordinary epitaxial growth method. The first n-type GaP epitaxial layer 2 was doped with Si to have a carrier concentration of $4 \times 10^{17}$ cm$^{-3}$ and was formed to have a thickness of 60 μm.

Figure 6:
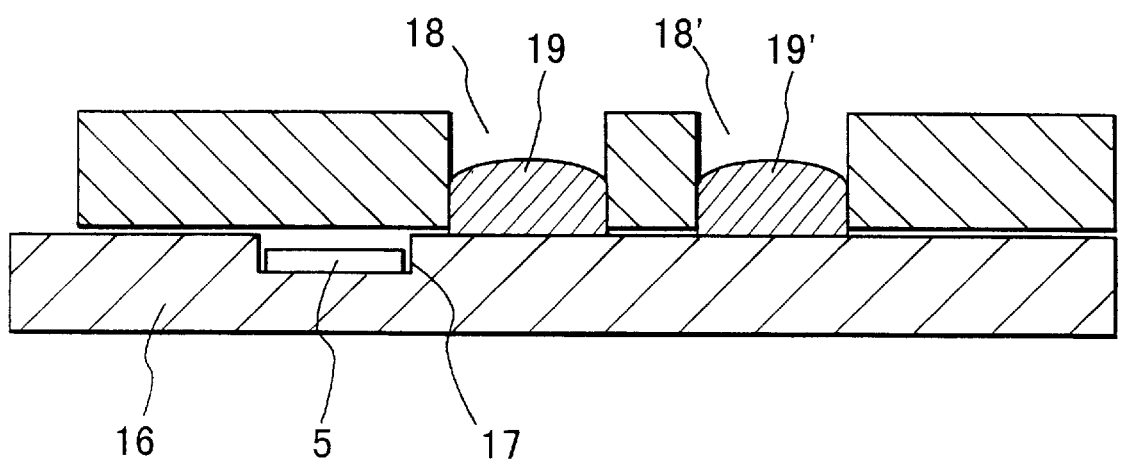
FIG. 6 is a schematic sectional view of a sliding boat used for epitaxial growth in a second embodiment of the invention.

The substrate 5 formed with the first n-type GaP epitaxial layer 2 was set in the substrate chamber 17 in the substrate holder 16 of the sliding boat shown in FIG. 6. Ga metal, GaP polycrystal and Ga$_2$S$_3$ (as sulfur source) for forming an epitaxial growth melt 19 for the second n-type GaP epitaxial layer 3 were placed in the first melt container 18. Ga metal and GaP polycrystal for forming an epitaxial growth melt 19' for the p-type GaP epitaxial layer 4 were placed in the second melt container 18'.

The slide boat was placed in an epitaxial growth furnace with the substrate 5 and the epitaxial growth melts 19, 19' still separated. The furnace was heated to 1000° C. in a stream of hydrogen and maintained at 1000° C. for one hour. The substrate holder 16 was slid to guide the n-type GaP epitaxial layer growth melt 19 onto the substrate 5. The melt and the substrate were then gradually cooled to 900° C. at a cooling rate of 1° C./minute to grow the second n-type GaP epitaxial layer 3.

The substrate holder 16 was then slid again at 900° C. to guide the p-type GaP epitaxial layer growth melt 19' onto the substrate having the second n-type GaP epitaxial layer 3 grown thereon. Zinc vapor was passed into the hydrogen stream to incorporate a prescribed amount of zinc into the p-type GaP epitaxial layer growth melt 19'. The temperature was then gradually lowered to 800° C. at a cooling rate of 1° C./minute to grow the p-type GaP epitaxial layer 4.

The amount of zinc vapor added was increased when the temperature fell below 850° C. in order to make the carrier concentration of the p-type GaP epitaxial layer 4 higher on the upper surface side than on the side thereof interfacing with the second n-type GaP epitaxial layer 3.

When the growth stopped, the substrate and the epitaxial growth melt were separated and cooled to normal room temperature, thereby affording an epitaxial wafer.

In the epitaxial wafer obtained, the carrier concentration of the second n-type GaP epitaxial layer 3 on the side thereof interfacing with the p-type GaP epitaxial layer 4 was $2 \times 10^{17}$ cm$^{-3}$. The carrier concentration of the p-type GaP epitaxial layer 4 on the side thereof interfacing with the second n-type GaP epitaxial layer 3 was $6 \times 10^{17}$ cm$^{-3}$ and the carrier concentration on the upper surface side thereof was $20 \times 10^{17}$ cm$^{-3}$. The sulfur concentration in the p-type GaP epitaxial layer 4 was $5 \times 10^{16}$ cm$^{-3}$.

Although sulfur was not intentionally added to the p-type GaP epitaxial layer growth melt 19', a small amount of sulfur came to be included in the p-type GaP epitaxial layer 4 owing to sulfur that found its way into the epitaxial growth melt 19' from the n-type GaP epitaxial layer growth melt 19 and/or from the starting material or the atmosphere.

GaP light-emitting diodes were fabricated from the so-obtained epitaxial wafer in the manner of Example 1.

The brightness of a light-emitting diode specimen fabricated from the epitaxial wafer is shown in Table 1.

TABLE 1

|  | Brightness (Relative) |
|---|---|
| Example 1 | 17.5 |
| Example 2 | 19.8 |
| Comparative Example | 14.4 |

The results in Table 1 show that the GaP pure green light-emitting diode of Example 1 according to the invention exhibited about 22% higher brightness than the conventional GaP pure green light-emitting diode of the Comparative Example.

Moreover, the GaP pure green light-emitting diode of Example 2 whose second n-type GaP epitaxial layer and p-type GaP epitaxial layer were grown from different epitaxial growth melts exhibited about 38% higher brightness than the conventional GaP pure green light-emitting diode of the Comparative Example.

The effect of the invention is obvious from these results.

As is clear from the foregoing, the invention provides an epitaxial wafer for a GaP pure green light emitting diode and a light-emitting diode of higher brightness than obtainable by the prior art.

Although the sliding boat method was used for epitaxial growth in the examples explained, the invention is not limited to use of this method but can also achieve like results using other growth methods such as the dip method.

In the Example 2, the second n-type GaP epitaxial layer and the p-type GaP epitaxial layer were grown from separate epitaxial growth melts by successively growing the second n-type GaP epitaxial layer and the p-type GaP epitaxial layer. However, the same results can also be obtained by, for example, growing the second n-type GaP epitaxial layer and the p-type GaP epitaxial layer in completely independent epitaxial growth steps.

What is claimed is:

1. An epitaxial wafer for a GaP pure green light emitting diode comprising an n-type single crystal GaP substrate formed in order thereon with a first n-type GaP epitaxial layer, a second n-type GaP epitaxial layer and a p-type GaP epitaxial layer, the p-type GaP epitaxial layer having a sulfur concentration of not greater than $1 \times 10^{17}$ cm$^{-3}$, the second n-type GaP epitaxial layer having a carrier concentration on a side thereof interfacing with the p-type GaP epitaxial layer of $0.5–5 \times 10^{17}$ cm$^{-3}$, and the p-type GaP epitaxial layer having a carrier concentration on a side thereof interfacing with the second n-type GaP epitaxial layer that is $1–10 \times 10^{17}$ cm$^{-3}$ and is not less than twice the carrier concentration of the second n-type GaP epitaxial layer on the side thereof interfacing with the p-type GaP epitaxial layer.

2. An epitaxial wafer according to claim 1, wherein the second n-type GaP epitaxial layer has a carrier concentration on the side thereof interfacing with the p-type GaP epitaxial layer of $1–3 \times 10^{17}$ cm$^{-3}$.

3. An epitaxial wafer according to claim 2, wherein the p-type GaP epitaxial layer has a carrier concentration on an upper surface side thereof of $10–50 \times 10^{17}$ cm$^{-3}$.

4. An epitaxial wafer according to claim 3, wherein the second n-type GaP epitaxial layer and the p-type GaP epitaxial layer are epitaxial layers grown from different epitaxial growth melts.

5. An epitaxial wafer according to claim 2, wherein the second n-type GaP epitaxial layer and the p-type GaP epitaxial layer are epitaxial layers grown from different epitaxial growth melts.

6. An epitaxial wafer according to claim 1, wherein the p-type GaP epitaxial layer has a carrier concentration on an upper surface side thereof of $10–50 \times 10^{17}$ cm$^{-3}$.

7. An epitaxial wafer according to claim 6, wherein the second n-type GaP epitaxial layer and the p-type GaP epitaxial layer are epitaxial layers grown from different epitaxial growth melts.

8. An epitaxial wafer according to claim 1, wherein the second n-type GaP epitaxial layer and the p-type GaP epitaxial layer are epitaxial layers grown from different epitaxial growth melts.

9. A GaP pure green light-emitting diode comprising:

an n-type single crystal GaP substrate formed in order thereon with a first n-type GaP epitaxial layer, a second n-type GaP epitaxial layer and a p-type GaP epitaxial layer, an n-type electrode provided on a back surface of the single crystal substrate, and a p-type electrode provided on an upper surface of the p-type GaP epitaxial layer, the p-type GaP epitaxial layer having a sulfur concentration of not greater than $1 \times 10^{17}$ cm$^{-3}$, the second n-type GaP epitaxial layer having a carrier concentration on a side thereof interfacing with the p-type GaP epitaxial layer of $0.5-5 \times 10^{17}$ cm$^{-3}$, and the p-type GaP epitaxial layer having a carrier concentration on a side thereof interfacing with the second n-type GaP epitaxial layer that is $1-10 \times 10^{17}$ cm$^{-3}$ and is not less than twice the carrier concentration of the second n-type GaP epitaxial layer on the side thereof interfacing with the p-type GaP epitaxial layer.

10. A light-emitting diode according to claim 9, wherein the second n-type GaP epitaxial layer has a carrier concentration on the side thereof interfacing with the p-type GaP epitaxial layer of $1-3 \times 10^{17}$ cm$^{-3}$.

11. A light-emitting diode according to claim 10, wherein the p-type GaP epitaxial layer has a carrier concentration on an upper surface side thereof of $10-50 \times 10^{17}$ cm$^{-3}$.

12. A light-emitting diode according to claim 11, wherein the second n-type GaP epitaxial layer and the p-type GaP epitaxial layer are epitaxial layers grown from different epitaxial growth melts.

13. A light-emitting diode according to claim 10, wherein the second n-type GaP epitaxial layer and the p-type GaP epitaxial layer are epitaxial layers grown from different epitaxial growth melts.

14. A light-emitting diode according to claim 9, wherein the p-type GaP epitaxial layer has a carrier concentration on an upper surface side thereof of $10-50 \times 10^{17}$ cm$^{-3}$.

15. A light-emitting diode according to claim 14, wherein the second n-type GaP epitaxial layer and the p-type GaP epitaxial layer are epitaxial layers grown from different epitaxial growth melts.

16. A light-emitting diode according to claim 9, wherein the second n-type GaP epitaxial layer and the p-type GaP epitaxial layer are epitaxial layers grown from different epitaxial growth melts.

* * * * *